US012751192B2

(12) United States Patent
(10) Patent No.: US 12,751,192 B2
(45) Date of Patent: Sep. 29, 2026
Shin et al.

(54) DISPLAY APPARATUS AND METHOD OF MANUFACTURING THE SAME

(71) Applicant: Samsung Display Co., LTD., Yongin-si (KR)

(72) Inventors: Hyuneok Shin, Yongin-si (KR); Joonyong Park, Yongin-si (KR); Juhyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 344 days.

(21) Appl. No.: 18/357,413

(22) Filed: Jul. 24, 2023

(65) Prior Publication Data

US 2024/0155925 A1 May 9, 2024

(30) Foreign Application Priority Data

Nov. 4, 2022 (KR) ........................ 10-2022-0146386

(51) Int. Cl.
*H10K 59/80* (2023.01)
*G09G 3/3233* (2016.01)

(52) U.S. Cl.
CPC ....... *H10K 59/8792* (2023.02); *G09G 3/3233* (2013.01); *G09G 2300/0819* (2013.01); *G09G 2300/0842* (2013.01); *G09G 2300/0861* (2013.01)

(58) Field of Classification Search
CPC ............. H10K 59/8792; G09G 3/3233; G09G 2300/0819; G09G 2300/0842; G09G 2300/0861
See application file for complete search history.

(56) References Cited

U.S. PATENT DOCUMENTS

| | | | |
|---|---|---|---|
| 11,088,216 B2 | 8/2021 | Bae et al. | |
| 2020/0168838 A1 | 5/2020 | Hong et al. | |
| 2020/0303466 A1 | 9/2020 | Park et al. | |
| 2020/0373359 A1 | 11/2020 | Lee et al. | |

(Continued)

FOREIGN PATENT DOCUMENTS

| | | | |
|---|---|---|---|
| CN | 105118928 A | * 12/2015 | ......... H10K 59/8792 |
| CN | 111725253 | 9/2020 | |
| CN | 113591686 | 11/2021 | |

(Continued)

OTHER PUBLICATIONS

IP.com search history.*
Korean Notice of Allowance for KR Application No. 10-2022-0146386, dated May 27, 2026, 8 pages.

*Primary Examiner* — Fatima N Farokhrooz
(74) *Attorney, Agent, or Firm* — Womble Bond Dickinson (US) LLP

(57) ABSTRACT

Provided are a display apparatus and a method of manufacturing the display apparatus. The display apparatus includes a display panel including a display area, transparent partitions disposed over the display panel, in the display area, a first layer surrounding a side surface of each of the transparent partitions and including an oxide of a first light-absorbing material, a second layer surrounding a side surface of the first layer and including the first light-absorbing material, and a third layer surrounding a side surface of the second layer, including the oxide of the first light-absorbing material, and having a uniform thickness.

10 Claims, 12 Drawing Sheets

(56) References Cited

U.S. PATENT DOCUMENTS

2022/0052094 A1 2/2022 Chen et al.

FOREIGN PATENT DOCUMENTS

| | | | |
|---|---|---|---|
| KR | 10-2016-0067849 | | 6/2016 |
| KR | 10-2020-0059551 | A | 5/2020 |
| KR | 10-2020-0061667 | A | 6/2020 |
| KR | 10-2020-0111859 | A | 10/2020 |
| KR | 10-2020-0124372 | | 11/2020 |
| KR | 10-2020-0135130 | A | 12/2020 |

* cited by examiner

DISPLAY APPARATUS AND METHOD OF MANUFACTURING THE SAME

CROSS-REFERENCE TO RELATED APPLICATION(S)

This application claims priority to and benefits of Korean Patent Application No. 10-2022-0146386 under 35 U.S.C. § 119, filed on Nov. 4, 2022, in the Korean Intellectual Property Office, the entire contents of which are incorporated herein by reference.

BACKGROUND

1. Technical Field

One or more embodiments relate to a display apparatus and a method of manufacturing the same, and, to a display apparatus capable of emitting only output light in a given direction among output light generated by a display panel and a method of manufacturing the display apparatus.

2. Description of the Related Art

A display apparatus may display an image by receiving information about the image. Output light generated by a display panel included in the display apparatus may be emitted in various directions.

Thus, a viewing angle control technology capable of emitting only output light in a straight direction among output light through an optical functional layer disposed over the display panel may be required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus capable of emitting only output light in a given direction among output light generated by a display panel and a method of manufacturing the display apparatus. However, these are examples and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a display panel including a display area; transparent partitions disposed over the display panel in the display area; a first layer surrounding a side surface of each of the transparent partitions and including an oxide of a first light-absorbing material; a second layer surrounding a side surface of the first layer and including the first light-absorbing material; and a third layer surrounding a side surface of the second layer, including the oxide of the first light-absorbing material, and having a uniform thickness.

The first light-absorbing material may include molybdenum (Mo) and tantalum (Ta).

The oxide of the first light-absorbing material may include molybdenum tantalum oxide ($MoTaO_x$ (MTO)).

A thickness of the first layer may decrease towards the display panel.

When viewed in a direction perpendicular to the display panel (or in a plan view), an area of an upper surface of the first layer may be greater than an area of a lower surface of the first layer.

The transparent partitions may include at least a first transparent partition and a second transparent partition, the first layer may include a (1-1)th layer surrounding a side surface of the first transparent partition and a (1-2)th layer surrounding a side surface of the second transparent partition, and a distance between the (1-1)th layer and the (1-2)th layer may increase towards the display panel.

A thickness of the second layer may decrease towards the display panel.

The oxide of the first light-absorbing material may comprise molybdenum tantalum oxide (MoTaOx (MTO)), and a thickness of the first layer decreases towards the display panel. The display apparatus may include an area of an upper surface of the first layer is greater than an area of a lower surface of the first layer in a plan view, the transparent partitions comprise at least a first transparent partition; and a second transparent partition, the first layer comprises: a (1-1)th layer surrounding a side surface of the first transparent partition; and a (1-2)th layer surrounding a side surface of the second transparent partition, a distance between the (1-1)th layer and the (1-2)th layer increases towards the display panel. a thickness of the second layer decreases towards the display panel, and transparent partitions comprise polyamide (PI).

According to one or more embodiments, a method of manufacturing a display apparatus may include forming transparent partitions over a display panel; forming a first layer surrounding a side surface of each of the transparent partitions and including an oxide of a first light-absorbing material; forming a second layer surrounding a side surface of the first layer and including the first light-absorbing material; and forming a third layer including the oxide of the first light-absorbing material and having a uniform thickness by exposing a surface of the second layer to oxygen plasma.

The forming of the first layer may include covering an upper surface and a side surface of each of the transparent partitions and an upper surface of the display panel exposed between the transparent partitions, with the oxide of the first light-absorbing material, and removing the oxide of the first light-absorbing material covering the upper surface of each of the transparent partitions and the upper surface of the display panel exposed between the transparent partitions.

The forming of the second layer may include covering the upper surface of each of the transparent partitions, the side surface of the first layer, and the upper surface of the display panel re-exposed by removing the oxide of the first light-absorbing material, with the first light-absorbing material, and removing the first light-absorbing material covering the upper surface of each of the transparent partitions, the upper surface of the first layer, and the re-exposed upper surface of the display panel, by using an anisotropic dry etching process.

The forming of the third layer may include oxidizing the first light-absorbing material of the surface of the second layer by using the oxygen plasma.

The forming of the third layer may include adjusting a time for exposing the surface of the second layer to the oxygen plasma, according to a target thickness of the third layer.

The first light-absorbing material may include molybdenum (Mo) and tantalum (Ta).

The oxide of the first light-absorbing material may include molybdenum tantalum oxide ($MoTaO_x$ (MTO)).

The transparent partitions may include polyamide (PI).

A thickness of the first layer may decrease towards the display panel.

A thickness of the second layer may decrease towards the display panel.

BRIEF DESCRIPTION OF THE DRAWINGS

The above and other aspects, features, and advantages of given embodiments of the disclosure will be more apparent from the following description taken in conjunction with the accompanying drawings, in which.

DETAILED DESCRIPTION OF THE EMBODIMENTS

Figure 1:
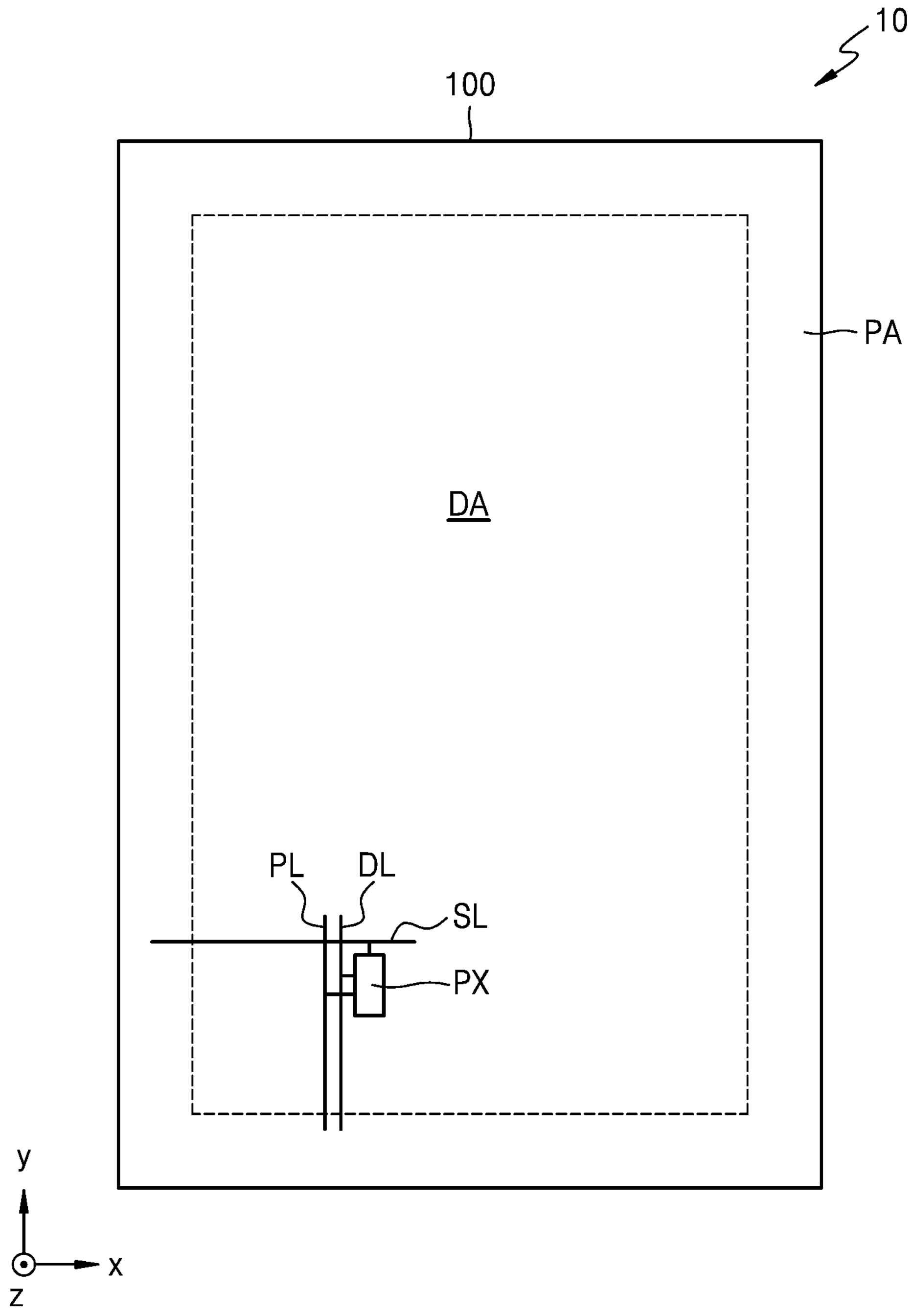
FIG. 1 is a schematic plan view schematically illustrating a display panel of a display apparatus according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The disclosure may include various embodiments and modifications, and given embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

As used herein, the singular forms, "a," "an," and "the" are intended to include the plural forms as well, unless the context clearly indicates otherwise.

Hereinafter, embodiments will be described in detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, the disclosure is not limited thereto.

It will be understood that in case that an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof in case that used in this specification, specify the presence of stated features, integers, steps, operations, elements, components, and/or groups thereof, but do not preclude the presence or addition of one or more other features, integers, steps, operations, elements, components, and/or groups thereof.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display apparatus according to an embodiment will be described in detail based on the above descriptions.

FIG. 1 is a schematic plan view schematically illustrating a display panel of a display apparatus according to an embodiment.

As illustrated in FIG. 1, a display apparatus according to an embodiment may include a display panel 10. The display apparatus may be of any type as long as it includes the display panel 10. For example, the display apparatus may be any one of various display apparatuses such as smartphones, tablets, laptops, televisions, or billboards. The display apparatus according to an embodiment may include thin film transistors and a capacitor, and the thin film transistors and the capacitor may be implemented by conductive layers and insulating layers.

The display panel 10 may include a display area DA and a peripheral area PA located outside the display area DA. FIG. 1 illustrates that the display area DA has a rectangular shape. However, the disclosure is not limited thereto. For example, the display area DA may have various shapes such as circular shapes, elliptical shapes, polygonal shapes, or particular figure shapes.

The display area DA may be an area for displaying an image, and pixels PX may be arranged in the display area DA. Each pixel PX may include a display device such as an organic light emitting diode. Each pixel PX may emit, for example, red, green, or blue light. Each pixel PX may be connected to a pixel circuit including a thin film transistor (TFT), a storage capacitor, and/or the like within the spirit and the scope of the disclosure. The pixel circuit may be connected to a scan line SL to transmit a scan signal, a data line DL intersecting with the scan line SL and to transmit a data signal, and a driving voltage line PL to supply a driving voltage. The scan line SL may extend in an x direction (hereinafter referred to as a second direction), and the data line DL and the driving voltage line PL may extend in a y direction (hereinafter referred to as a first direction).

The pixel PX may emit light with a brightness corresponding to an electrical signal from the electrically connected pixel circuit. The display area DA may display a given image through the light emitted from the pixel PX. For reference, the pixel PX may be defined as an emission area emitting any one of red light, green light, and blue light as described above.

The peripheral area PA may be an area in which a pixel PX is not arranged and may be an area that does not display an image. A power supply line for driving the pixel PX may be located in the peripheral area PA. Also, pads may be arranged in the peripheral area PA, and a printed circuit board including a driving circuit unit or an integrated circuit device such as a driver IC may be arranged to be electrically connected to the pads.

For reference, because the display panel 10 includes a substrate 100, the substrate 100 may be said to include the display area DA and the peripheral area PA. The substrate 100 will be described below in detail.

Also, transistors may be arranged in the display area DA. As for the transistors, depending on the type (N type or P type) and/or the operation condition of the transistor, a first terminal of the transistor may be a source electrode or a drain electrode, and a second terminal thereof may be an electrode different from the first terminal. For example, in case that the first terminal is a source electrode, the second terminal may be a drain electrode.

The transistors may include a driving transistor, a data writing transistor, a compensation transistor, an initialization transistor, an emission control transistor, and/or the like within the spirit and the scope of the disclosure. The driving transistor may be connected between the driving voltage line PL and an organic light emitting diode OLED, and the data writing transistor may be connected to the data line DL and the driving transistor and may perform a switching operation of transmitting the data signal received through the data line DL.

The compensation transistor may compensate for a threshold voltage of the driving transistor by connecting the driving transistor with the organic light emitting diode OLED by being turned on according to the scan signal received through the scan line SL.

The initialization transistor may initialize a gate electrode of the driving transistor by transmitting an initialization voltage to the gate electrode of the driving transistor by being turned on according to the scan signal received through the scan line SL. The scan line connected to the initialization transistor may be a separate scan line different from the scan line connected to the compensation transistor.

The emission control transistor may be turned on according to an emission control signal received through an emission control line, and as a result, a driving current may flow through the organic light emitting diode OLED.

The organic light emitting diode OLED may include a pixel electrode (anode) and an opposite electrode (cathode), and the opposite electrode may receive a second power voltage ELVSS. The organic light emitting diode OLED may display an image by emitting light by receiving a driving current from the driving transistor.

Hereinafter, an organic light emitting display apparatus is described as an example of the display apparatus according to an embodiment; however, the display apparatus of the disclosure is not limited thereto. In other embodiments, the display apparatus of the disclosure may be a display apparatus such as an inorganic light emitting display apparatus (or an inorganic EL display apparatus) or a quantum dot light emitting display apparatus. For example, an emission layer of the display device included in the display apparatus may include an organic material or an inorganic material. Also, the display apparatus may include an emission layer and quantum dots located on the path of light emitted from the emission layer.

Figure 2:
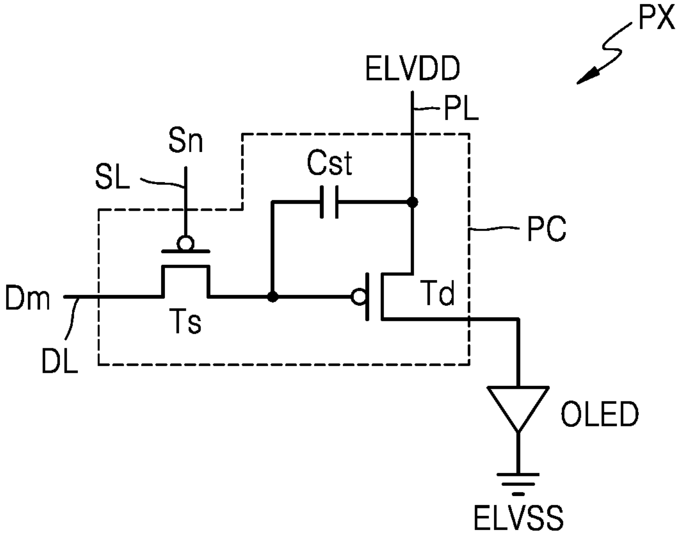
FIG. 2 is an equivalent circuit diagram of a pixel included in the display panel of FIG. 1.

FIG. 2 is an equivalent circuit diagram of a pixel included in the display panel of FIG. 1.

As illustrated in FIG. 2, each pixel PX may include a pixel circuit PC connected to a scan line SL and a data line DL and an organic light emitting diode OLED connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may transmit a data signal Dm input through the data line DL to the driving thin film transistor Td according to a scan signal Sn input through the scan line SL.

The storage capacitor Cst may be connected to the switching thin film transistor Ts and a driving voltage line PL and may store a voltage corresponding to the difference between a voltage received from the switching thin film transistor Ts and a first power voltage ELVDD supplied to the driving voltage line PL.

A second power voltage ELVSS may be a driving voltage having a relatively lower level than the first power voltage ELVDD. The level of the driving voltage supplied to each pixel PX may be equal to the difference between the level of the first power voltage ELVDD and the level of the second power voltage EVLSS.

The driving thin film transistor Td may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a given brightness according to the driving current.

FIG. 2 illustrates a case where the pixel circuit PC includes two thin film transistors and one storage capacitor; however, the disclosure is not limited thereto. The pixel circuit PC may include two or more storage capacitors.

Figure 3:
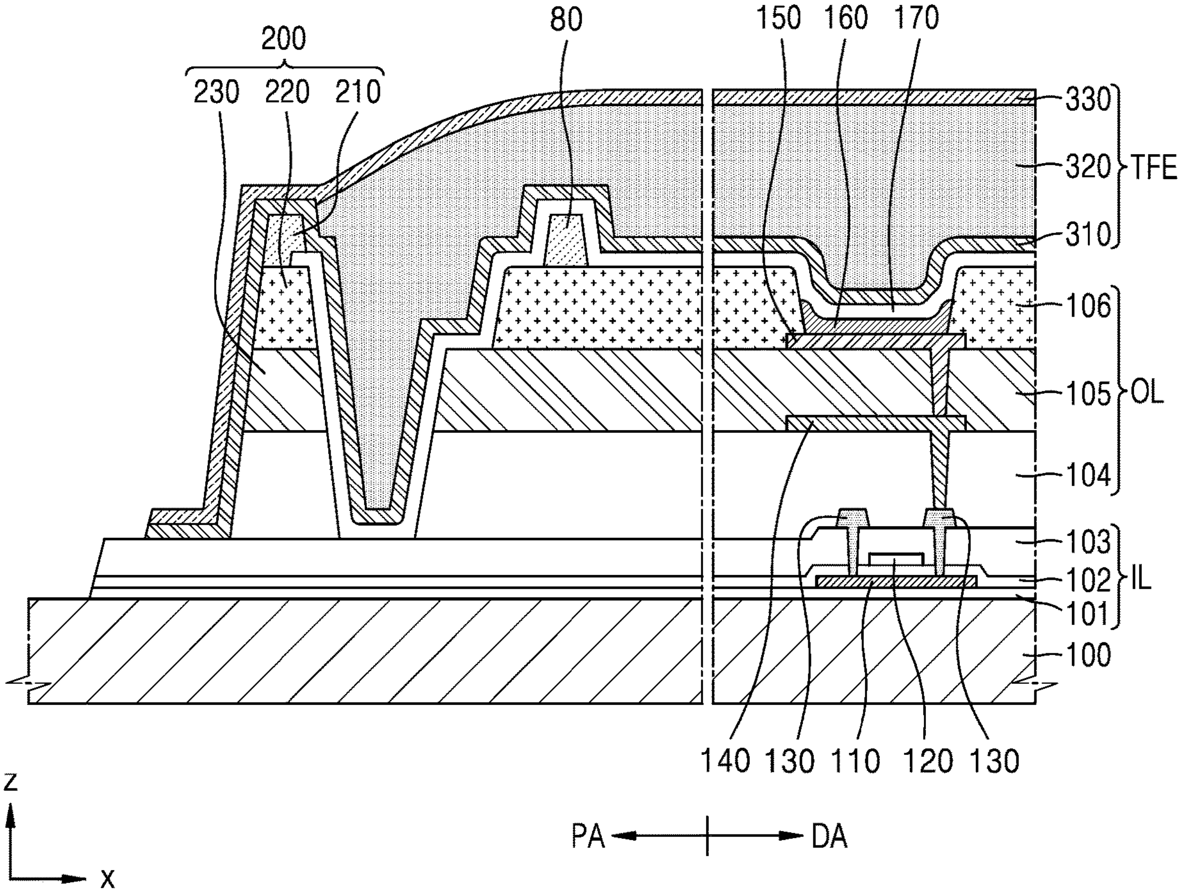
FIG. 3 is a schematic cross-sectional view schematically illustrating a portion of the display panel of FIG. 1.

FIG. 3 is a schematic cross-sectional view schematically illustrating a portion of the display panel of FIG. 1.

As described above, the substrate 100 may include areas corresponding to the display area DA and the peripheral area PA outside the display area DA. The substrate 100 may include various materials having flexible or bendable characteristics. For example, the substrate 100 may include glass, metal, or polymer resin. Also, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may be variously modified such as including a multilayer structure including two layers including the polymer resin and a barrier layer located between the two layers and including an inorganic material (for example, silicon oxide, silicon nitride, or silicon oxynitride).

A buffer layer 101 may be disposed over the substrate 100. The buffer layer 101 may function as a barrier layer and/or a blocking layer for preventing impurity ions from being diffused, preventing penetration of moisture or external air, and planarizing the surface thereof. The buffer layer 101 may include silicon oxide, silicon nitride, or silicon oxynitride. Also, the buffer layer 101 may control a heat supply rate during a crystallization process for forming a semiconductor layer 110, such that the semiconductor layer 110 may be uniformly crystallized.

The semiconductor layer 110 may be located over the buffer layer 101. The semiconductor layer 110 may include polysilicon and may include a channel area not doped with dopants, and a source area and a drain area formed by doping on both sides of the channel area. Here, the dopants may vary depending on the types of thin film transistors and may be N-type dopants or P-type dopants.

A gate insulating layer 102 may be located over the semiconductor layer 110. The gate insulating layer 102 may secure the insulation between the semiconductor layer 110 and a gate layer 120. The gate insulating layer 102 may include an inorganic material such as silicon oxide, silicon nitride, and/or silicon oxynitride and may be arranged between the semiconductor layer 110 and the gate layer 120. Also, the gate insulating layer 102 may have a shape corresponding to the entire surface of the substrate 100 and may have structure in which a contact hole formed at a preset portion. As such, an insulating layer including an inorganic material may be formed through chemical vapor deposition (CVD) or atomic layer deposition (ALD). This may also apply to the following embodiments and modifications thereof.

The gate layer 120 may be located over the gate insulating layer 102. The gate layer 120 may be arranged at a position vertically overlapping the semiconductor layer 110 and may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). The gate layer 120 will be described below in detail.

An interlayer insulating layer 103 may be located over the gate layer 120. The interlayer insulating layer 103 may cover the gate layer 120. The interlayer insulating layer 103 may include an inorganic material. For example, the interlayer insulating layer 103 may include a metal oxide or a metal nitride, and for example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). In some embodiments, the interlayer insulating layer 103 may include a dual structure of $SiO_x/SiN_y$ or $SiN_x/SiO_y$.

A first conductive layer 130 may be located over the interlayer insulating layer 103. The first conductive layer 130 may function as an electrode connected to the source/drain area of the semiconductor layer through a through hole included in the interlayer insulating layer 103. The first conductive layer 130 may include one or more metals among aluminum (Al), platinum (Pt), palladium (Pd), silver (Ag), magnesium (Mg), gold (Au), nickel (Ni), neodymium (Nd), iridium, chromium (Cr), lithium (Li), calcium (Ca), molybdenum (Mo), titanium (Ti), tungsten (W), and copper (Cu). For example, the first conductive layer 130 may include a Ti layer, an Al layer, and/or a Cu layer.

A first organic insulating layer 104 may be located over the first conductive layer 130. The first organic insulating layer 104 may be an organic insulating layer functioning as a planarization layer by covering the upper portion of the first conductive layer 130 and having a substantially flat upper surface. The first organic insulating layer 104 may include, for example, an organic material such as acryl, benzocyclobutene (BCB), or hexamethyldisiloxane (HMDSO). The first organic insulating layer 104 may be variously modified, such as including a single layer or multiple layers.

A second conductive layer 140 may be located over the first organic insulating layer 104. The second conductive layer 140 may function as an electrode connected to the source or drain area of the semiconductor layer through a through hole included in the first organic insulating layer 104. The second conductive layer 140 may include one or more metals among aluminum (Al), platinum (Pt), palladium (Pd), silver (Ag), magnesium (Mg), gold (Au), nickel (Ni), neodymium (Nd), iridium, chromium (Cr), lithium (Li), calcium (Ca), molybdenum (Mo), titanium (Ti), tungsten (W), and copper (Cu). For example, the second conductive layer 140 may include a Ti layer, an Al layer, and/or a Cu layer.

A second organic insulating layer 105 may be located over the first conductive layer 130. The second organic insulating layer 105 may be an organic insulating layer functioning as a planarization layer by covering the upper portion of the first conductive layer 130 and having a substantially flat upper surface. The second organic insulating layer 105 may include, for example, an organic material such as acryl, benzocyclobutene (BCB), or hexamethyldisiloxane (HMDSO). The second organic insulating layer 105 may be variously modified, such as including a single layer or multiple layers.

Also, although not illustrated in FIG. 3, an additional conductive layer and an additional insulating layer may be arranged between the conductive layer and the pixel electrode, and various embodiments may be made therein. The additional conductive layer may include a same material or a similar material and may have a same layer structure as the above conductive layer. Also, the additional insulating layer may include a same material or a similar material and may have a same layer structure as the above organic insulating layer.

A pixel electrode 150 may be located over the second organic insulating layer 105. The pixel electrode 150 may be connected to the second conductive layer 140 through a contact hole formed in the second organic insulating layer 105. A display device may be located over the pixel electrode 150. An organic light emitting diode OLED may be used as the display device. For example, the organic light emitting diode OLED may be disposed, for example, over the pixel electrode 150. The pixel electrode 150 may include a transparent conductive layer formed of a transparent conductive oxide such as ITO, $In_2O_3$, or IZO, and a reflective layer formed of a metal such as Al or Ag. For example, the pixel electrode 150 may have a three-layer structure of ITO/Ag/ITO.

A pixel definition layer 106 may be located over the second organic insulating layer 105 and may be arranged to cover the edge of the pixel electrode 150. For example, the pixel definition layer 106 may cover the edge of the pixel electrode 150. The pixel definition layer 106 may include an opening portion corresponding to the pixel PX, and the opening portion may be formed to expose at least a central portion of the pixel electrode 150. The pixel definition layer 106 may include, for example, an organic material such as polyimide or hexamethyldisiloxane (HMDSO). Also, a spacer 80 may be disposed over the pixel definition layer 106.

The spacer 80 is illustrated as being located over the peripheral area PA but may also be located over the display area DA. The spacer 80 may prevent the organic light emitting diode OLED from being damaged by the deflection of a mask in a manufacturing process using a mask. The spacer 80 may include an organic insulating material and may be formed as a single layer or multiple layers.

An intermediate layer 160 and an opposite electrode 170 may be located over the opening portion of the pixel definition layer 106. The intermediate layer 160 may include a low-molecular weight or high-molecular weight material, and in case that including a low-molecular weight material, the intermediate layer 160 may include a hole injection layer, a hole transport layer, an emission layer, an electron transport layer, and/or an electron injection layer. In case that including a high-molecular weight material, the intermediate layer 160 may generally have a structure including a hole transport layer and an emission layer.

The opposite electrode 170 may include a transparent conductive layer formed of a transparent conductive oxide such as ITO, $In_2O_3$, or IZO. The pixel electrode 150 may be used as an anode, and the opposite electrode 170 may be used as a cathode. However, the polarities of the electrodes may be applied in reverse.

The structure of the intermediate layer 160 is not limited thereto and it may have various structures. For example, at least one of the layers constituting the intermediate layer 160 may be integrally formed like the opposite electrode 170. In an embodiment, the intermediate layer 160 may include a layer patterned to correspond to each of pixel electrodes 150.

The opposite electrode 170 may be disposed over the display area DA and may be disposed over the entire surface of the display area DA. For example, opposite electrode 170 may be integrally formed to cover pixels. The opposite electrode 170 may electrically contact a common power supply line (not illustrated) arranged in the peripheral area PA. In an embodiment, the opposite electrode 170 may extend to a barrier 200. A thin film encapsulation layer TFE may be arranged to cover the entire display area DA and extend toward the peripheral area PA to cover at least a portion of the peripheral area PA.

The thin film encapsulation layer TFE may extend to the outside of the common power supply line (not illustrated). The thin film encapsulation layer TFE may include a first inorganic encapsulation layer 310, a second inorganic encapsulation layer 330, and an organic encapsulation layer 320 arranged therebetween. The first inorganic encapsulation layer 310 and the second inorganic encapsulation layer 330 may include one or more inorganic materials such as aluminum oxide, titanium oxide, tantalum oxide, hafnium oxide, zinc oxide, silicon oxide, silicon nitride, and/or silicon oxynitride.

The first inorganic encapsulation layer 310 and the second inorganic encapsulation layer 330 may include a single layer or multiple layers including the above material. The first inorganic encapsulation layer 310 and the second inorganic encapsulation layer 330 may include a same material or a similar material or may include different materials. The first inorganic encapsulation layer 310 and the second inorganic encapsulation layer 330 may have different thicknesses. The thickness of the first inorganic encapsulation layer 310 may be greater than the thickness of the second inorganic encapsulation layer 330. By way of example, the thickness of the second inorganic encapsulation layer 330 may be greater than the thickness of the first inorganic encapsulation layer 310, or the first inorganic encapsulation layer 310 and the second inorganic encapsulation layer 330 may have a same thickness.

The organic encapsulation layer 320 may include a monomer-based material or a polymer-based material. The polymer-based material may include acryl-based resin, epoxy-based resin, polyimide, polyethylene, and the like within the spirit and the scope of the disclosure. In an embodiment, the organic encapsulation layer 320 may include acrylate.

The barrier 200 may be located over the peripheral area PA of the substrate 100. In an embodiment, the barrier 200 may include a portion of the first organic insulating layer 104, a portion 230 of the second organic insulating layer

105, a portion 220 of the pixel definition layer 106, and a portion 210 of the spacer 80; however, the disclosure is not limited thereto.

In some cases, the barrier 200 may include only a portion 230 of the second organic insulating layer 105 or a portion 220 of the pixel definition layer 106. The barrier 200 may be arranged to surround the display area DA and may prevent the organic encapsulation layer 320 of the thin film encapsulation layer TFE from overflowing to the outside of the substrate 100. Thus, the organic encapsulation layer 320 may contact the inner surface of the barrier 200 facing the display area DA. The fact that the organic encapsulation layer 320 contacts the inner surface of the barrier 200 may mean that the first inorganic encapsulation layer 310 is located between the organic encapsulation layer 320 and the barrier 200 and the organic encapsulation layer 320 contacts the first inorganic encapsulation layer 310.

The first inorganic encapsulation layer 310 and the second inorganic encapsulation layer 330 may be disposed over the barrier 200 and may extend toward the edge of the substrate 100. However, in some cases, barriers 200 may be included.

Figure 4:
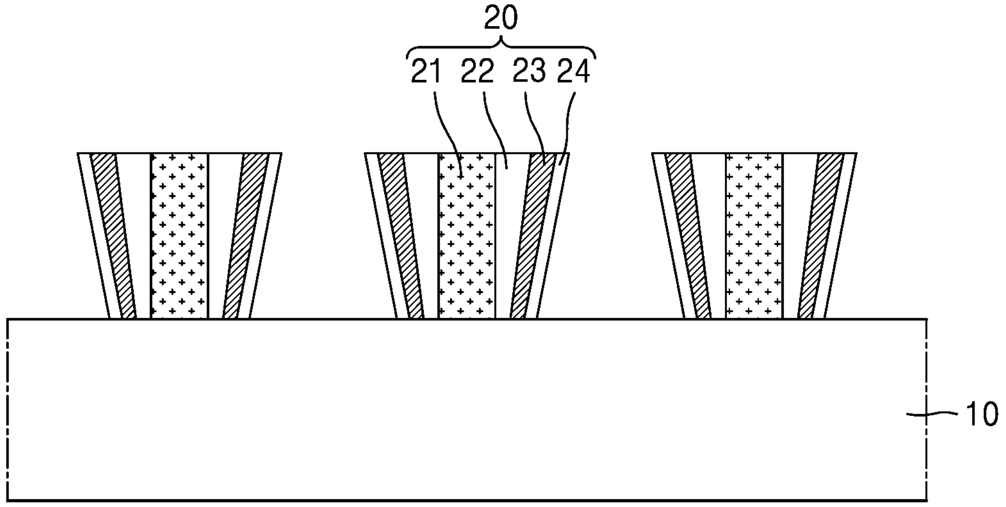
FIG. 4 is a schematic cross-sectional view schematically illustrating the display panel of FIG. 1 and an optical functional layer disposed over the display panel.

FIG. 4 is a schematic cross-sectional view schematically illustrating the display panel of FIG. 1 and an optical functional layer disposed over the display panel. For reference, herein, "the side surface" may refer to a surface facing in a direction parallel to the substrate among various directions. In other words, herein, "the side surface" may refer to a surface other than the lower surface facing the substrate and the upper surface facing in the opposite direction of the substrate among the surfaces constituting the component in the schematic cross-sectional view such as FIG. 4 or the like within the spirit and the scope of the disclosure.

As illustrated in FIG. 4, the display apparatus according to an embodiment may include a display panel 10 and an optical functional layer disposed over the display panel 10. The optical functional layer may include light-absorbing structures 20 disposed over the display panel 10. For example, light-absorbing structures 20 may include transparent partitions 21 disposed over the display panel 10 and light-absorbing layers 22, 23, and 24 surrounding the side surface of each of the transparent partitions 21.

The display apparatus according to an embodiment may have an in-cell structure in which a light-absorbing structure formed around a transparent partition using an organic layer is formed over the display panel 10, instead of having a structure in which an optical film is attached onto the display panel. Thus, the display apparatus according to an embodiment may have a marginal advantage in that it does not require a separate material for attaching the optical film and does not involve an additional process for attaching the optical film.

The light-absorbing layers 22, 23, and 24 may include a first layer 22 surrounding the side surface of each of the transparent partitions 21, a second layer 23 surrounding the side surface of the first layer 22, and a third layer 24 surrounding the side surface of the second layer 23.

The transparent partitions 21 may be arranged in the display area DA of the display panel 10. The transparent partitions 21 may extend in a direction perpendicular to the upper surface of the display panel 10. The transparent partitions 21 may include a transparent material and may include an organic material having transparency. For example, each of the transparent partitions 21 may include polyamide (PI). Herein, the transparent partition 21 may function as a support for forming a layer including a light-absorbing material and may simultaneously have a structure that is transparent and thus may transmit output light.

The first layer 22 may surround the side surface of the transparent partition 21 and may include an oxide of a first light-absorbing material. The second layer 23 may surround the side surface of the first layer 22 and may include a first light-absorbing material. The third layer 24 may surround the side surface of the second layer 23 and may include an oxide of a first light-absorbing material. The third layer 24 may have a uniform thickness.

The first layer 22 may have a nonuniform thickness. For example, the thickness of the first layer 22 may decrease toward the display panel 10. As described below in the description of a manufacturing method, the first layer 22 may be formed by an anisotropic etching process.

In case that the first layer 22 is formed by an anisotropic etching process, it may have a nonuniform thickness. Because the oxide of the first light-absorbing material is vulnerable to an etching solution, the thickness of the first layer 22 may relatively decrease toward the display panel 10. For example, when viewed in a direction perpendicular to the display panel 10, the area of the upper surface of the first layer 22 may be greater than the area of the lower surface of the first layer 22.

The first layer 22 may prevent the light input into the transparent partition 21 from escaping through the side surface thereof. For example, the first layer 22 may absorb the light escaping through the side surface such that the light input into each of the transparent partitions 21 may be output in a straight direction.

The thickness of the second layer 23 may decrease toward the display panel 10. For example, like the first layer 22, the second layer 23 may also have a nonuniform thickness. Because the first light-absorbing material is vulnerable to an etching solution, the thickness of the second layer 23 may relatively decrease toward the display panel 10. For example, when viewed in a direction perpendicular to the display panel 10, the area of the upper surface of the second layer 23 may be greater than the area of the lower surface of the second layer 23.

The first light-absorbing material included in the second layer 23 may include molybdenum (Mo) and tantalum (Ta). By way of example, the first light-absorbing material may include at least one of molybdenum (Mo), manganese (Mn), and magnesium (Mg), and these materials may be metals having light absorption coefficients. By way of example, the first light-absorbing material may be a molybdenum alloy. Because a molybdenum alloy is more resistant to an etching solution or a cleaning solution than pure molybdenum (Mo), the surface of a layer including a molybdenum alloy may be less damaged in an etching process or a cleaning process.

Also, the oxide of the first light-absorbing material included in the first layer 22 and the third layer 24 may include molybdenum tantalum oxide ($MoTaO_x$ (MTO)). For example, the first layer 22 and the third layer 24 may include a material obtained by oxidizing molybdenum (Mo) and tantalum (Ta), which is the first light-absorbing material described above.

The content of tantalum (Ta) in molybdenum tantalum oxide ($MoTaO_x$ (MTO)) may be about 2 at % or more and about 15 at % or less. Molybdenum (Mo) is a light-absorbing material; however, the light absorbance of molybdenum (Mo) may decrease as the content of tantalum (Ta) increases. Nevertheless, in case that the light-absorbing layers 22, 23, and 24 are formed of only pure molybdenum (Mo), because pure molybdenum (Mo) is readily dissolved in a cleaning solution (for example, water), tantalum (Ta) may be mixed in a given proportion to prevent this limitation. Thus, a suitable proportion of tantalum (Ta) may be important.

In case that the content of tantalum (Ta) is less than about 2 at %, the light-absorbing layers 22, 23, and 24 may be readily dissolved in the cleaning solution and thus the surfaces of the light-absorbing layers 22, 23, and 24 may be readily damaged. On the other hand, in case that the content of tantalum (Ta) is greater than about 15 at %, the light absorbance of the light-absorbing layers 22, 23, and 24 may be excessively reduced.

As described below in the description of the manufacturing method, the third layer 24 may be formed by an oxygen ($O_2$) plasma process and may not be formed by a separate etching process. In case that the third layer 24 is formed by an etching process, a uniform thickness thereof may uniformly be formed and it may be eroded by a solvent (for example, tetramethylammonium hydroxide (TMAH)) used in a subsequent process such as a cleaning process. As a result, a structural instability may be caused such that a crack may occur in the surface of the third layer 24 and the thickness thereof may decrease toward the display panel 10. As such, in case that a structural instability is caused such that a crack occurs in the surface of the third layer 24, the light absorption performance thereof may be significantly degraded.

The third layer 24 may transmit only light in a straight direction among the output light passing through the outside of the transparent partition 21 and may absorb oblique output light among the output light of the display panel 10. Thus, it may be important that the outside surface of the third layer 24 is not damaged.

Thus, the third layer 24 of the display apparatus according to an embodiment may be formed in such a way that the second layer 23 is oxidized by an oxygen plasma process so that an etching process and a subsequent process of the etching process may not be required, and as a result, the third layer 24 may have a uniform thickness.

For example, the thickness of the third layer 24 may refer to a vertical distance between one surface or a surface contacting the second layer 23 and another surface located in the opposite direction of the second layer 23. The thickness of the third layer 24 may refer to a thickness in a direction parallel to the display panel 10 from a surface where the second layer 23 and the third layer 24 meet each other.

The fact that the third layer 24 has a uniform thickness may mean a case where the same thickness is measured at any points. By way of example, the fact that the third layer 24 has a uniform thickness may mean a case where the thickness is measured within an error range of about 10% at any points. The third layer 24 may have a uniform thickness within a 10% error range.

Figure 5:
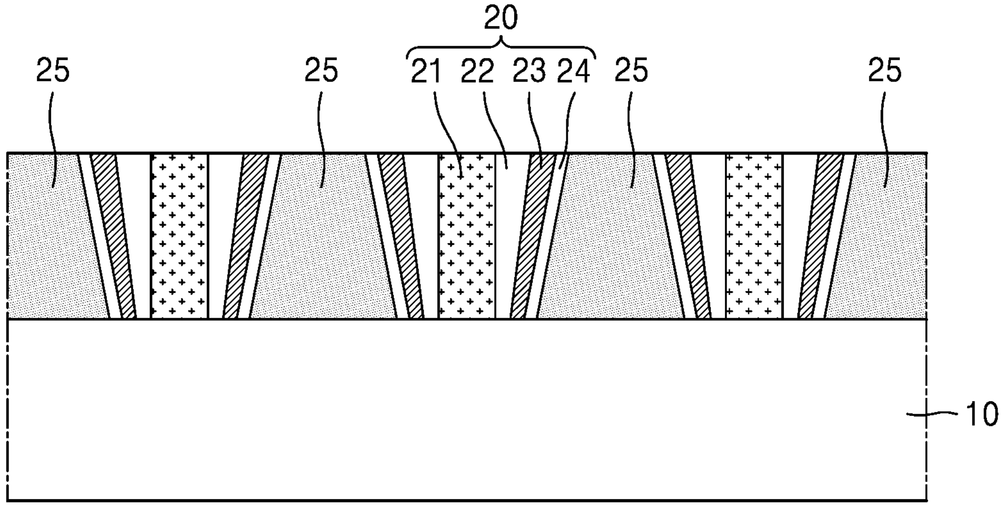
FIG. 5 is a schematic cross-sectional view schematically illustrating the display panel of FIG. 1 and an optical functional layer disposed over the display panel.

FIG. 5 is a schematic cross-sectional view schematically illustrating the display panel of FIG. 1 and an optical functional layer disposed over the display panel.

As illustrated in FIG. 5, the optical functional layer may further include an organic material layer 25 filling the space between the light-absorbing structures 20. The organic material layer 25 may include a transparent organic material such as polyamide (PI).

Figure 6:
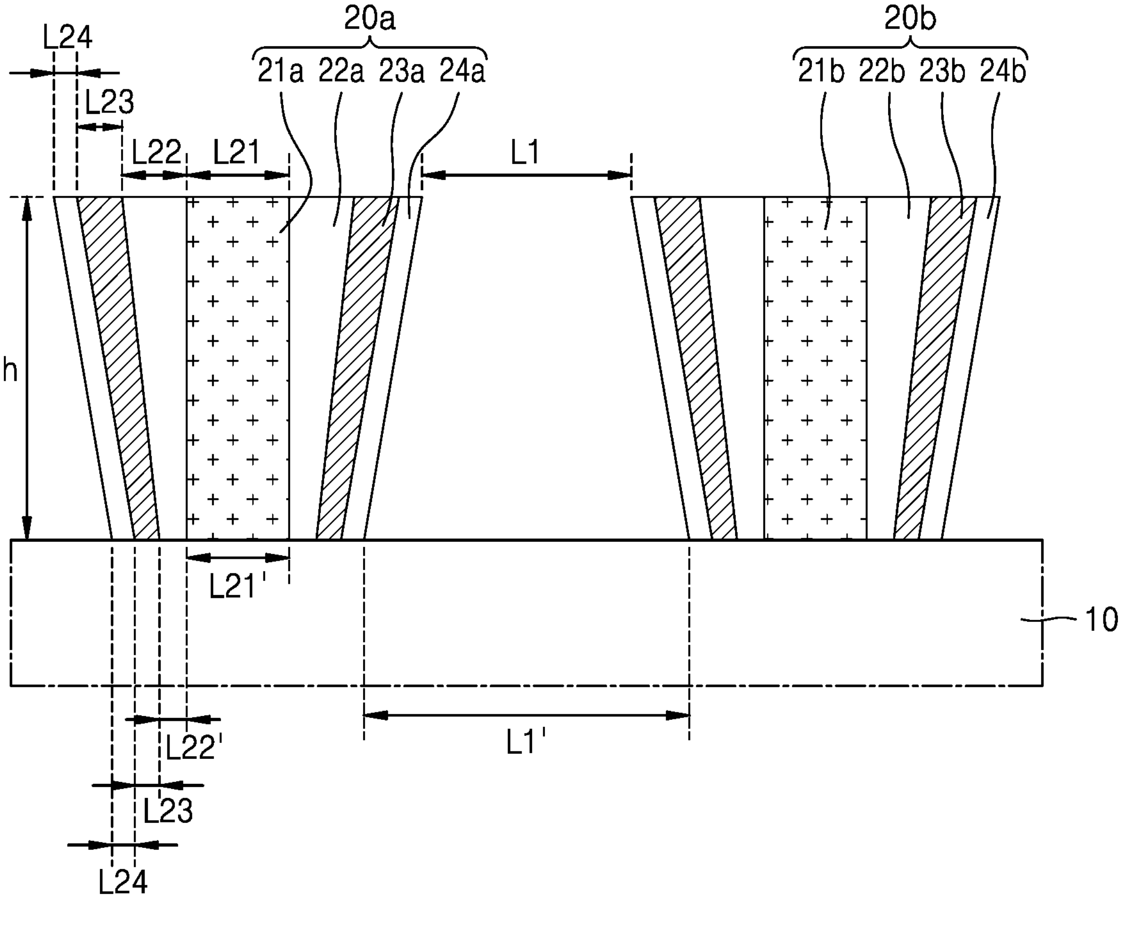
FIG. 6 is a schematic cross-sectional view schematically illustrating a display panel and an optical functional layer disposed over the display panel.

FIG. 6 is a schematic cross-sectional view schematically illustrating a display panel and an optical functional layer disposed over the display panel.

As illustrated in FIG. 6, the light-absorbing structures 20 may include at least a first light-absorbing structure **20*a* and a second light-absorbing structure 20*b*. Other light-absorbing structures not illustrated in FIG. 6** may be further included.

The first layer 22 may include a (1-1)th layer **22*a* surrounding the side surface of a first transparent partition 21*a*. Also, the first layer 22 may include a (1-2)th layer 22*b* surrounding the side surface of a second transparent partition 21*b*. Also, the first layer 22** may further include other layers respectively surrounding the side surfaces of other transparent partitions.

The second layer 23 may include a (2-1)th layer **23*a* surrounding the side surface of the (1-1)th layer 22*a*. Also, the second layer 23 may include a (2-2)th layer 23*b* surrounding the side surface of the (1-2)th layer 22*b*. Also, the second layer 23** may further include other layers respectively surrounding the side surfaces of other transparent partitions.

The third layer 24 may include a (3-1)th layer **24*a* surrounding the side surface of the (2-1)th layer 23*a*. Also, the third layer 24 may include a (3-2)th layer 24*b* surrounding the side surface of the (2-2)th layer 23*b*. Also, the third layer 24** may further include other layers respectively surrounding the side surfaces of other transparent partitions.

A width L21 of the upper surface and a width L21' of the lower surface of the first transparent partition **21*a* included in the first light-absorbing structure 20*a* may be equal to each other. A width L22 of the upper surface of the (1-1)th layer 22*a* may be greater than a width L22' of the lower surface of the (1-1)th layer 22*a*. A width L23 of the upper surface of the (2-1)th layer 23*a* may be greater than a width L23' of the lower surface of the (2-1)th layer 23*a*. This may be because the (2-1)th layer 23*a* is also formed by an etching process. A width L24 of the upper surface of the (3-1)th layer 24*a* may be equal to a width L24' of the lower surface of the (3-1)th layer 24*a***.

The characteristics of the components **21*b*, 22*b*, 23*b*, and 24*b* included in the second light-absorbing structure 20*b* may be the same as the characteristics of the components 21*a*, 22*a*, 23*a*, and 24*a* included in the first light-absorbing structure 20*a***.

The lower surface (L21', L22', L23', L24') may refer to a surface where the optical functional layer and the display panel 10 contact each other, and the upper surface (L21, L22, L23, L24) may refer to a surface located on the opposite side of the lower surface (L21', L22', L23', L24').

The distance between the (1-1)th layer **22*a* and the (1-2)th layer 22*b* may increase toward the display panel 10**.

Also, because the thicknesses of the (2-1)th layer **23*a* and the (2-2)th layer 23*b* may not be uniform and may increase toward the display panel 10, the distance between the (2-1)th layer 23*a* and the (2-2)th layer 23*b* may increase toward the display panel 10**.

Also, because the thicknesses of the (3-1)th layer **24*a* and the (3-2)th layer 24*b* are uniform, the distance between the (3-1)th layer 24*a* surrounding the side surface of the (2-1)th layer 23*a* and the (3-2)th layer 24*b* surrounding the side surface of the (2-2)th layer 23*b* may be determined by the nonuniform thicknesses of the (1-1)th layer 22*a*, the (1-2)th layer 22*b*, the (2-1)th layer 23*a*, and the (2-2)th layer 23*b*. For example, the distance between the (3-1)th layer 24*a* and the (3-2)th layer 24*b* may increase toward the display panel 10**.

In other words, a distance L1 between the upper surface of the (3-1)th layer **24*a* and the upper surface of the (3-2)th layer 24*b* may be less than a distance L1' between the lower surface of the (3-1)th layer 24*a* and the lower surface of the (3-2)th layer 24*b***.

Hereinafter, a method of manufacturing a display apparatus according to an embodiment (hereinafter referred to as a manufacturing method) will be described in detail based on the above descriptions. However, in the following description of the manufacturing method according to an embodiment, the same descriptions as or redundant descriptions with the descriptions of the display apparatus described above may be omitted for conciseness.

The light-absorbing structures 20, including the first light-absorbing structure 20*a* and the second light-absorbing structure 20*b*, may have approximately the same height h. For example, the height h of the first light-absorbing structure 20*a* may be the same as a height of the second light-absorbing structure 20*b*. In addition, other light-absorbing structures not shown in FIG. 6 may also have approximately the same height. Therefore, a description of the height of each of the other light-absorbing structures may be replaced by the description of the height of the first light-absorbing structure 20*a* below.

The height H of the first light-absorbing structure 20*a* may be defined as a vertical distance from a top surface of the display panel 10 to a top surface of the first light-absorbing structure 20*a*. The top surface of the first light-absorbing structure 20*a* may be aligned with the top surface of the display panel 10. Thus, the height h of the first light-absorbing structure 20*a* may be a height of the first transparent bulkhead 21*a*, a height of the first layer 22*a*, a height of the second first layer 23*a*, or a height of the third first layer 24*a*. In this case, the height of the components comprising the first light-absorbing structure 20*a* may also be defined as a vertical distance from the top surface of the display panel 10 to the top surface of each of the components.

FIGS. 7 to 12 are schematic cross-sectional views schematically illustrating a display panel and an optical functional layer disposed over the display panel, according to process sequence.

Figure 7:
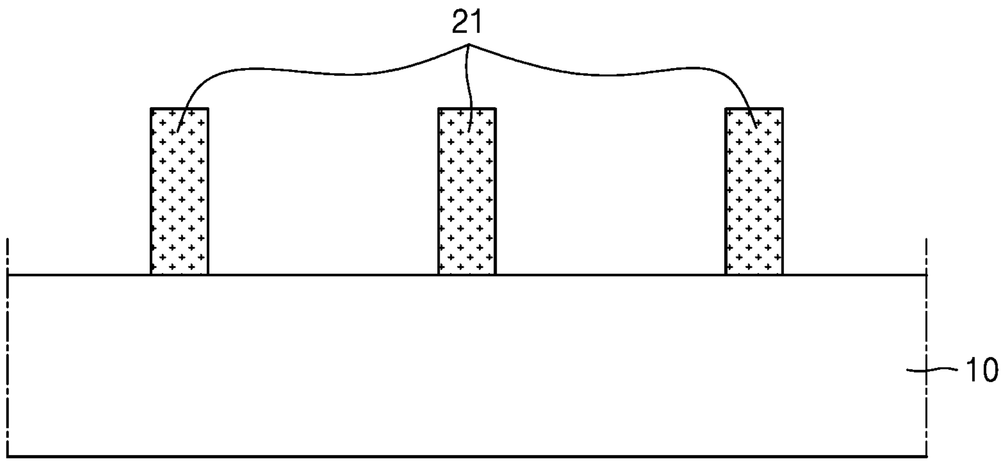
FIGS. 7 to 12 are schematic cross-sectional views schematically illustrating a display panel and an optical functional layer disposed over the display panel, according to a process sequence.

As illustrated in FIG. 7, the manufacturing method according to an embodiment may include an operation of forming transparent partitions 21 over a display panel 10. The transparent partitions 21 may include a transparent organic material such as polyamide (PI). The operation of forming of the transparent partitions 21 may include forming a polyamide (PI) layer over the display panel 10 and forming the transparent partitions 21 by using a mask with a pattern of a preset shape.

Figure 8:
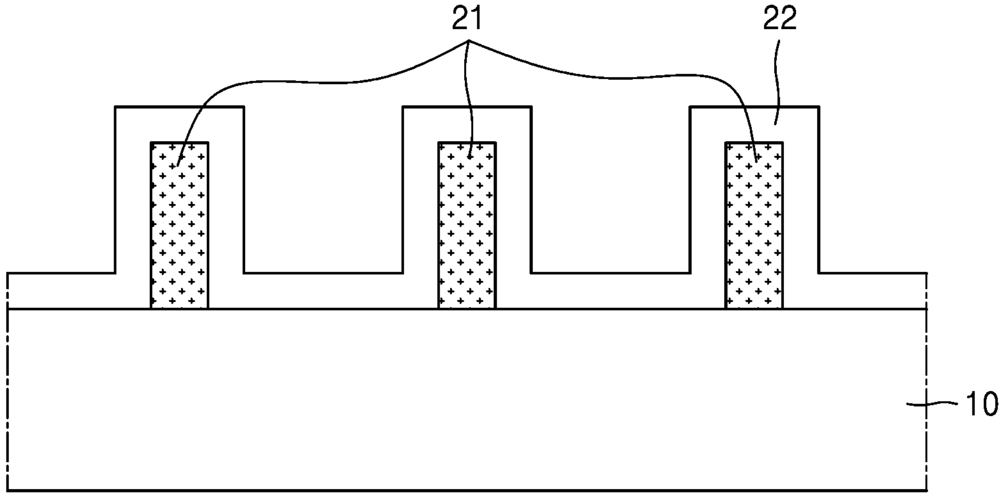
Figure 9:
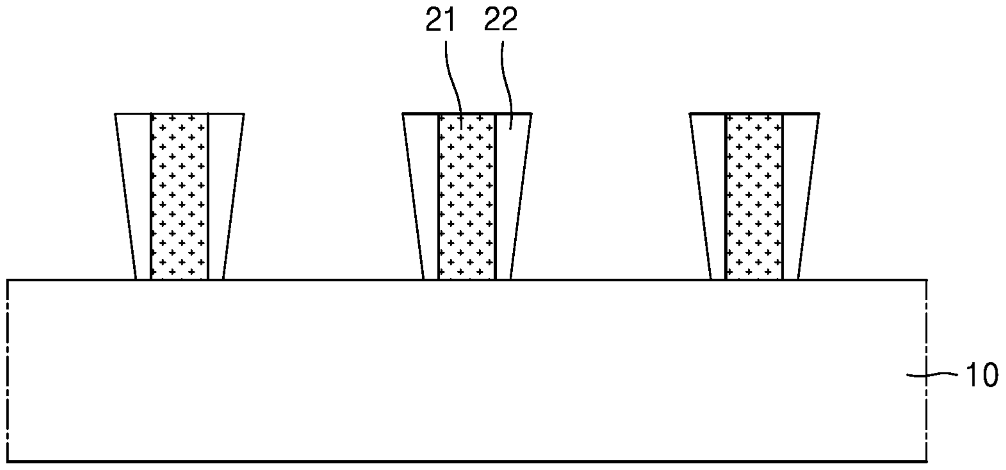

As illustrated in FIGS. 8 and 9, the manufacturing method according to an embodiment may further include, after the forming of the transparent partitions 21, an operation of forming a first layer 22 surrounding the side surface of each of the transparent partitions 21 and including an oxide of a first light-absorbing material. The oxide of the first light-absorbing material may include molybdenum tantalum oxide ($MoTaO_x$ (MTO)) as described above.

The operation of forming the first layer 22 may include forming an oxide layer of a first light-absorbing material covering the side surfaces and upper surfaces of the transparent partitions 21 and covering the upper surface of the display panel 10 exposed between the transparent partitions 21.

The operation of forming the first layer 22 may include forming the first layer 22 surrounding the side surface of each of the transparent partitions 21 by applying an anisotropic dry etching process to the oxide layer of the first light-absorbing material. According to the characteristics of the oxide of the first light-absorbing material that is vulnerable to the anisotropic dry etching process, the thickness of the first layer 22 formed may decrease toward the display panel 10.

For example, the operation of forming the first layer 22 may include an operation of covering the upper surface and side surface of each of the transparent partitions 21 and the upper surface of the display panel 10 exposed between the transparent partitions 21, with an oxide of a first light-absorbing material and an operation of removing the oxide of the first light-absorbing material covering the upper surface of each of the transparent partitions 21 and the upper surface of the display panel 10 exposed between the transparent partitions 21, by using an anisotropic dry etching process.

Figure 10:
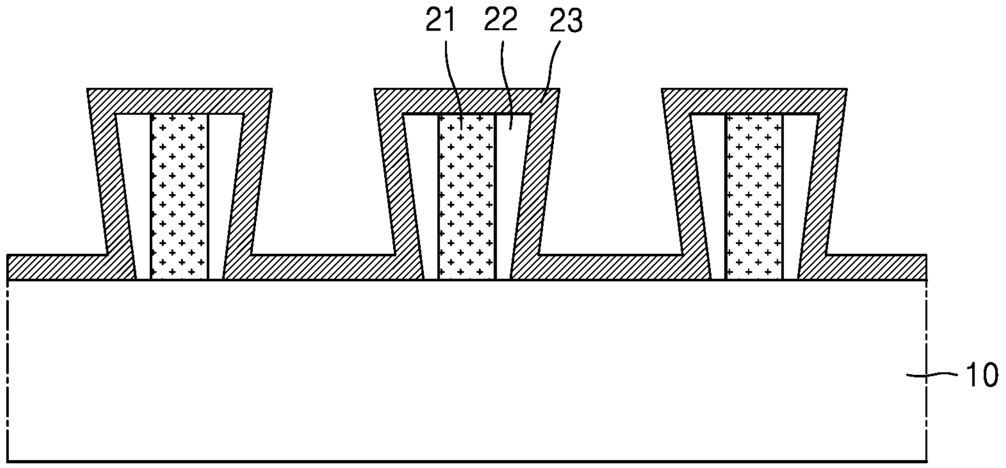
Figure 11:
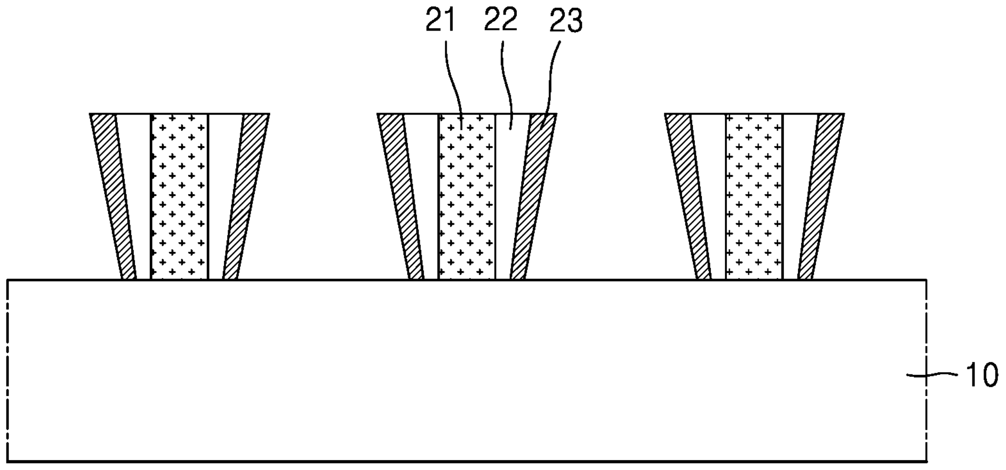

As illustrated in FIGS. 10 and 11, the manufacturing method according to an embodiment may further include, after the forming of the first layer 22, an operation of forming a second layer 23 surrounding the side surface of the first layer 22 and including a first light-absorbing material. The first light-absorbing material may include molybdenum (Mo) and tantalum (Ta) as described above.

The operation of forming the second layer 23 may include forming a first light-absorbing material layer covering the upper surfaces of the transparent partitions 21, the side surface of the first layer 22, and the upper surface of the first layer 22 and covering the upper surface of the display panel 10 exposed between the transparent partitions 21.

The operation of forming the second layer 23 may include forming the second layer 23 surrounding the side surface of the first layer 22 by applying an anisotropic dry etching process to the first light-absorbing material layer. The thickness of the second layer 23 formed by the anisotropic dry etching process may decrease toward the display panel 10.

For example, the operation of forming the second layer may include an operation of covering the upper surface of each of the transparent partitions 21, the side surface of the first layer 22, and the upper surface of the display panel 10 re-exposed by removing the oxide of the first light-absorbing material, with a first light-absorbing material and an operation of removing the first light-absorbing material covering the upper surface of each of the transparent partitions 21, the upper surface of the first layer 22, and the re-exposed upper surface of the display panel 10, by using an anisotropic dry etching process.

On the other hand, unlike the illustration in FIGS. 9 to 11, after an oxide layer of a first light-absorbing material corresponding to the first layer 22 is formed, after the first light-absorbing material layer corresponding to the second layer 23 is formed over the oxide layer of the first light-absorbing material, through a mask of a preset shape corresponding to the oxide layer of the first light-absorbing material corresponding to the first layer 22 and the first light-absorbing material layer corresponding to the second layer 23, the display apparatus of FIG. 11 may be directly manufactured by omitting the process of FIGS. 9 and 10.

Figure 12:
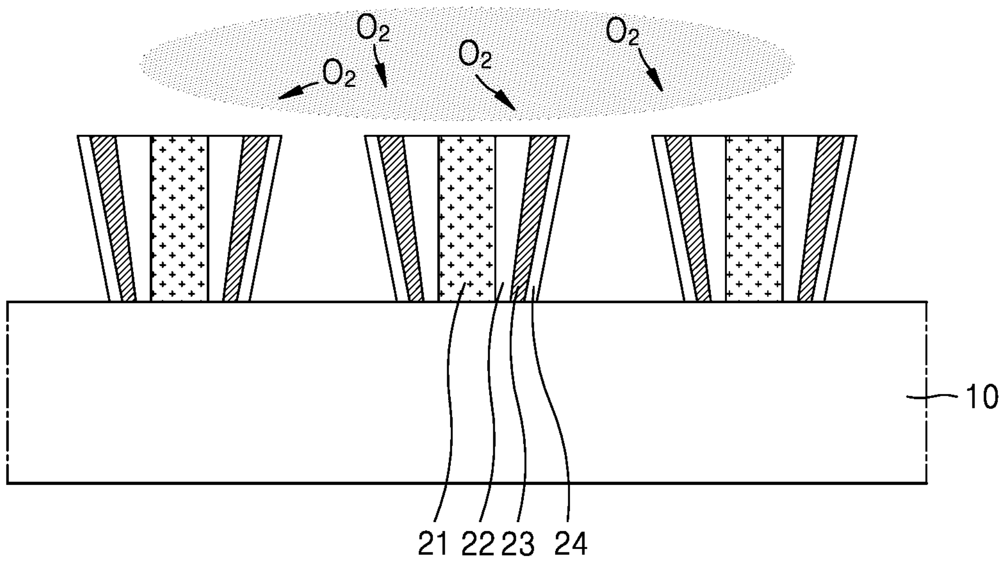

As illustrated in FIG. 12, the manufacturing method according to an embodiment may further include, after the forming of the second layer 23, an operation of forming a third layer 24 surrounding the side surface of the second layer 23 and including an oxide of the first light-absorbing material. The oxide of the first light-absorbing material may include molybdenum tantalum oxide ($MoTaO_x$ (MTO)) as described above.

The operation of forming the third layer 24 may be performed by an oxygen plasma process of injecting oxygen plasma into the second layer 23 preformed. The surface of the second layer 23 may be modified by being uniformly exposed to the oxygen plasma, and accordingly, the third layer 24 with a uniform thickness may be formed. As such, the third layer 24 formed without using an etching process may have a uniform thickness. The oxygen plasma process may have an advantage in that the thickness of the third layer 24 may be readily adjusted by adjusting the concentration of the oxygen plasma, the exposure time of the surface of the second layer 23, and/or the like within the spirit and the scope of the disclosure.

For example, a display apparatus formed up to the second layer 23 may be prepared in a vacuum chamber (not illustrated). Thereafter, oxygen plasma may be injected into the vacuum chamber (not illustrated) through a plasma generator (not illustrated) connected to the vacuum chamber (not illustrated). For example, the plasma generator (not illustrated) may be an electron cyclotron resonance (ECR) plasma generator. The ECR plasma generator may form high-density plasma having a high plasma electron temperature by simultaneously using an electric field and a magnetic field. The plasma generator (not illustrated) may include an electromagnetic wave oscillator, a resonator, and a magnet.

As an example, oxygen plasma may be provided for a time to the display apparatus prepared in the vacuum chamber (not illustrated), and accordingly, the surface of the second layer 23 may be oxidized and modified. The time during which the surface of the second layer 23 is exposed to the oxygen plasma may be adjusted according to the thickness of the third layer 24.

As such, the third layer 24 may be formed in a final process, and because an etching process or a cleaning process is not additionally required in the process of forming the third layer, the surface damage of the third layer formed by an oxygen plasma process (a process of exposing a target to oxygen plasma) may be minimized.

As described above, according to an embodiment, it may be possible to implement a display apparatus capable of emitting only output light in a given direction among output light generated by a display panel and a method of manufacturing the display apparatus. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus having a display area, comprising:
- a display panel;
- transparent partitions disposed over the display panel, in the display area;
- a first layer surrounding a side surface of each of the transparent partitions and comprising an oxide of a first light-absorbing material;
- a second layer surrounding a side surface of the first layer and comprising the first light-absorbing material; and
- a third layer surrounding a side surface of the second layer, comprising the oxide of the first light-absorbing material, and having a uniform thickness.

2. The display apparatus of claim 1, wherein the first light-absorbing material comprises molybdenum (Mo) and tantalum (Ta).

3. The display apparatus of claim 1, wherein the oxide of the first light-absorbing material comprises molybdenum tantalum oxide ($MoTaO_x$ (MTO)).

4. The display apparatus of claim 1, wherein a thickness of the first layer decreases towards the display panel.

5. The display apparatus of claim 1, wherein, an area of an upper surface of the first layer is greater than an area of a lower surface of the first layer in a plan view.

6. The display apparatus of claim 1, wherein
- the transparent partitions comprise:
  - at least a first transparent partition; and
  - a second transparent partition,
- the first layer comprises:
  - a (1-1)th layer surrounding a side surface of the first transparent partition; and
  - a (1-2)th layer surrounding a side surface of the second transparent partition, and
- a distance between the (1-1)th layer and the (1-2)th layer increases towards the display panel.

7. The display apparatus of claim 1, wherein a thickness of the second layer decreases towards the display panel.

8. The display apparatus of claim 1, wherein the transparent partitions comprise polyamide (PI).

9. The display apparatus of claim 2, wherein
- the oxide of the first light-absorbing material comprises molybdenum tantalum oxide ($MoTaO_x$ (MTO)), and
- a thickness of the first layer decreases towards the display panel.

10. The display apparatus of claim 9, wherein
- an area of an upper surface of the first layer is greater than an area of a lower surface of the first layer in a plan view,
- the transparent partitions comprise:
  - at least a first transparent partition; and
  - a second transparent partition,
- the first layer comprises:
  - a (1-1)th layer surrounding a side surface of the first transparent partition; and
  - a (1-2)th layer surrounding a side surface of the second transparent partition,
- a distance between the (1-1)th layer and the (1-2)th layer increases towards the display panel,
- a thickness of the second layer decreases towards the display panel, and
- the transparent partitions comprise polyamide (PI).

* * * * *